Figure 1:
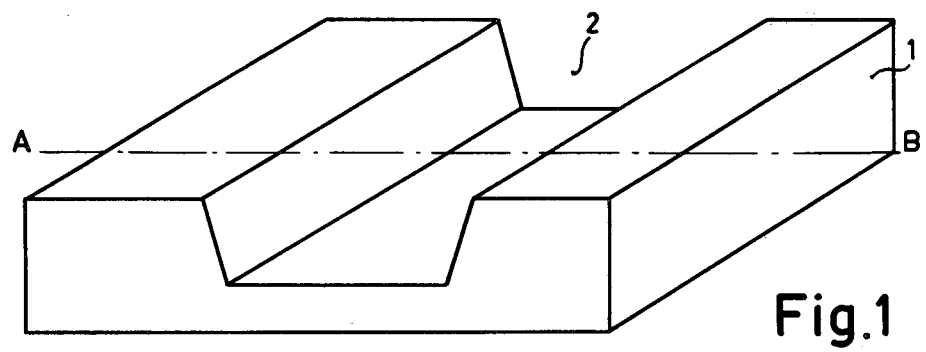

United States Patent [19]

Gerkema et al.

[11] 4,151,574
[45] Apr. 24, 1979

[54] MAGNETIC HEAD USING A MAGNETIC FIELD-SENSITIVE ELEMENT AND METHOD OF MANUFACTURING SAME

[75] Inventors: Jan Gerkema; Gerrit J. Koel, both of Emmasingel Eindhoven, Netherlands

[73] Assignee: U.S. Philips Corporation, New York, N.Y.

[21] Appl. No.: 880,442

[22] Filed: Feb. 23, 1978

Related U.S. Application Data

[63] Continuation of Ser. No. 690,530, May 27, 1976, which is a continuation of Ser. No. 579,845, May 22, 1975.

[30] Foreign Application Priority Data

May 24, 1974 [NL] Netherlands ..................... 7406962

[51] Int. Cl.² ........................... G11B 5/22; G11B 5/30
[52] U.S. Cl. .................................. 360/113; 360/122; 360/125
[58] Field of Search ............... 360/113, 122, 125, 112, 360/111; 427/131, 124, 48; 324/46; 29/603

[56] References Cited

U.S. PATENT DOCUMENTS

| | | | |
|---|---|---|---|
| 3,564,521 | 2/1971 | Trimble et al. | 29/603 |
| 3,686,751 | 8/1972 | Sugiyama | 360/112 |
| 3,814,863 | 7/1974 | O'Day | 360/113 |
| 3,840,898 | 10/1974 | Bajorek et al. | 360/125 |
| 3,881,190 | 4/1975 | Brock et al. | 360/113 |
| 3,887,944 | 6/1975 | Bajorek et al. | 360/113 |
| 3,987,485 | 10/1976 | Sugaya et al. | 360/113 |

*Primary Examiner*—Alfred H. Eddelman
*Attorney, Agent, or Firm*—Thomas A. Briody; Robert S. Smith

[57] ABSTRACT

A magnetic head for use in a magnetic reproduction device has a substrate in which a groove is provided. Provided on one wall of the groove is a magnetic field-sensitive element which is preferably positioned normal to an associated recording medium for coupling to the magnetic head.

2 Claims, 5 Drawing Figures

MAGNETIC HEAD USING A MAGNETIC FIELD-SENSITIVE ELEMENT AND METHOD OF MANUFACTURING SAME

This is a continuation of application Ser. No. 690,530, filed May 27, 1976; which is a continuation of Ser. No. 579,845, filed May 22, 1975.

The invention relates generally to a magnetic head for use in a magnetic reproduction device. The magnetic head comprises in particular a substrate on which a magnetic field-sensitive element is provided in the form of a thin film, the necessary leads being present to provide electric connections to external circuits.

In the manufacture of magnetic heads of the annular core type which so far has been the most usual type, the front face of the head is ground away, while the height of the gap is measured optically so as to determine the quantity of the material of the head which has still to be ground away or removed. The more time-consuming and hence expensive character makes such a method unfit for use in the series production of magnetic heads comprising magnetic field-sensitive elements, for example, Hall elements or magnetoresistance elements, in the form of thin films.

In the prior art series production process for heads of the above-described type, a number of magnetic field-sensitive elements in the form of thin films are provided, for example, by vapour deposition in vacuo, on substrates of a uniform size which form part of the ultimate head construction; electric leads for the elements are formed on each substrate by vapour depositing a metal thereon; by adhering the substrates each on a glass plate with the side having a thin film, the fundamental construction of a head is effected. When the method conventionally used in manufacturing heads of the annular core type were used, the front face of the head, that is to say the surface which is destined to be coupled to a magnetic recording medium, must then be ground away until a desired uniform height of the magnetic field-sensitive elements has been achieved. Due to the very small dimensions of the elements, the grinding away down to the required height is a very accurate and time-consuming job, while in the case of larger numbers of elements on a substrate it is very difficult to make the height of the elements uniform. Consequently, heads manufactured in this manner often have unequal characteristics relative to each other, that is to say, the reproducibility factor of the known method of manufacturing large numbers of uniform heads of the present type is low.

It is the object of the invention to provide a new and improved magnetic head, as well as a method of manufacturing same, which eliminates the drawbacks of the prior art. The invention provides in particular a head construction in which the grinding away of the front face of the head is no longer necessary.

For that purpose, the magnetic head according to the invention is characterized in that the magnetic field-sensitive element is provided on a side wall of a groove extending in a surface of the substrate.

The invention also relates to a method of manufacturing a magnetic head having a magnetic field-sensitive element. Said method is characterized in that a groove having a defined shape is provided in a surface of a substrate, that an auxiliary layer is vapour-deposited at a first angle with the substrate on the surface of the substrate on either side of the groove and on a wall of the groove, that a layer of magnetic field-sensitive material is vapour-deposited at a second angle with the substrate on the auxiliary layer on either side of the groove and on the wall of the groove present opposite to the said wall, that the auxiliary layer with the magnetic field-sensitive material present thereon is etched away, and that the remaining layer of magnetic field-sensitive material is connected to electric leads.

The invention will be described in greater detail, by way of example, with reference to the drawing, FIG. 1 is a perspective view of a first embodiment of a substrate for a magnetic head according to the invention.

Figure 2:
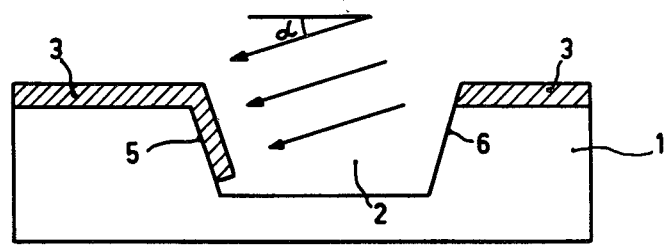
Figure 3:
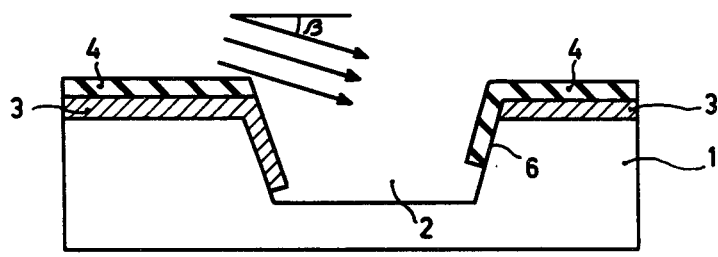
Figure 4:
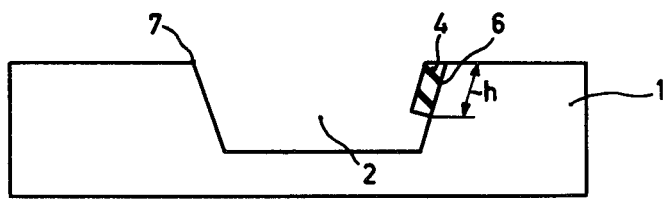

FIGS. 2, and 3 and 4 are cross-sectional views taken on the line A-B of the substrate shown in FIG. 1 during three successive stages of the method according to the invention.

Figure 5:
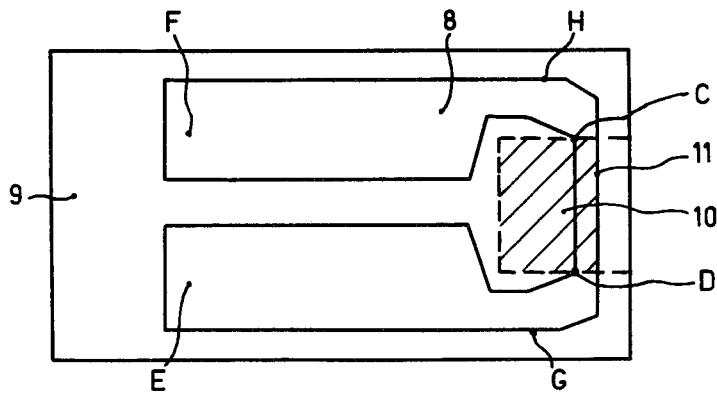

FIG. 5 is a plan view of a second embodiment of a substrate for a magnetic head according to the invention.

In FIG. 1, a groove 2 having a readily defined shape is provided in a substrate 1. When a detrition-resistant substrate is required, sapphire or a carbide may be chosen for that purpose and sputter etching is a suitable method of providing the groove 2. If on the contrary silicon is used as a substrate, a groove whose walls extend normal to the surface can be manufactured by means of anisotropic etching. Said normal position is to be preferred because the magnetic field-sensitive element to be provided will in that case also be normal to the surface.

In FIG. 2, an auxiliary layer 3 having a thickness between 500 and 10,000 Å of, for example, Al or Cu is vapour-deposited on the surface of the substrate 1 and on the wall 5 of the groove 2 at an angle $\alpha$ with the substrate 1. Due to the shadow effect of said vapour deposition method, an auxiliary layer is produced only in the places denoted in the Figure.

In FIG. 3 a layer 4 having a thickness of 1000 Å of a magnetic field-sensitive material, for example, a material having magnetoresistive properties (like Ni-Fe), is vapour-deposited on the wall 6 of the groove 2 at an angle $\rho$ with the substrate surface.

In FIG. 4, the auxiliary layer 3 with the part of the layer 4 present thereon is etched away, the layer 4 being broken off at the area of the surface so that only the part of the layer 4 on the wall 6 remains. The height h hereof is dependent only on the vapour deposition angle and on the place of the edge 7 and can be adjusted accurately. Dimensions of h of, for example, 5 microns ±0.5 can be realized in this manner. Grinding away of the substrate so as to adjust the height h is hence not necessary in the method according to the invention.

As has been already stated above, the material of the auxiliary layer 3 may be, for example, Al or Cu. Generally, said layer should consist of a material which can be etched away in the presence of a layer 4 which may not be attacked. In the case in which the layer 4 consists of NiFe, Al is a very suitable material for the auxiliary layer 3.

In FIG. 5, a groove 8 in the form of an open loop has been etched in the substrate 9. In the above-described manner, a layer of magnetoresistive material is provided on the outer wall 11 at least in the part right-hand linit of the groove 8 between the points G and H, via vapour-deposition at a first angle of an auxiliary layer, vapour-deposition at second angle of a layer of magnetoresistive material, and etching away the auxiliary layer including the layer of magnetoresistive material present thereon. A layer of lacquer 10 (shaded area) is then provided whih covers the part of the groove between C and D which corresponds to the groove 2 in FIG. 1. The remaining part of the groove 8 is then filled up to the surface of the substrate with a conductive material, for example Au. Due to the oblique transition of the groove at C and D, said conductive material readily contacts the magnetoresistive material present on the wall 11. At the points E and F the conductive material can be connected to an external circuit by means of "beam leads" or a "through hole plating" technique.

If desired it is also possible to fill the groove between C and D with, for example, SiO for further protection of the magnetoresistive layer provided on the wall 11 thereof. An extra step for building the magnetoresistive element in, as is necessary in the prior art, is not necessary in this case.

What is claimed is:

1. A magnetic head for reading data which are magnetically recorded on an associated relatively movable medium which comprises: a substrate having a generally planar face disposed in facing relationship with the associated medium, said face having a groove therein, said groove having a first side wall disposed in oblique relationship to said face, a magnetic field-sensitive element in the form of a thin film carried solely on said side wall of said groove and means for connecting said element to associated external sensing circuitry.

2. A magnetic head as claim in claim 1, wherein said magnetic field-sensitive element in a magnetoresistive element.

* * * * *